United States Patent
Song et al.

(10) Patent No.: US 9,060,445 B2
(45) Date of Patent: Jun. 16, 2015

(54) ELECTRONIC APPARATUS HAVING A DISPLAY PANEL

(71) Applicants: Byeong Yong Song, Goyang-si (KR); Se Hun Oh, Seoul (KR); Yeo Wan Yun, Seongnam-si (KR); Kyu Young Hong, Seongnam-si (KR)

(72) Inventors: Byeong Yong Song, Goyang-si (KR); Se Hun Oh, Seoul (KR); Yeo Wan Yun, Seongnam-si (KR); Kyu Young Hong, Seongnam-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 200 days.

(21) Appl. No.: 13/759,361

(22) Filed: Feb. 5, 2013

(65) Prior Publication Data

US 2013/0201621 A1   Aug. 8, 2013

(30) Foreign Application Priority Data

Feb. 6, 2012   (KR) .................. 10-2012-0011833

(51) Int. Cl.
*H05K 7/16*   (2006.01)
*G06F 1/16*   (2006.01)
*H04M 1/02*   (2006.01)

(52) U.S. Cl.
CPC ............ *H05K 7/16* (2013.01); *H04M 1/0216* (2013.01); *H04M 1/0237* (2013.01); *G06F 1/1624* (2013.01); *G06F 1/1626* (2013.01); *G06F 1/166* (2013.01)

(58) Field of Classification Search
USPC .................................................. 361/679.27
See application file for complete search history.

(56) References Cited

U.S. PATENT DOCUMENTS

| 6,262,785 | B1 * | 7/2001 | Kim ................................ 349/58 |
| 8,259,437 | B2 * | 9/2012 | Vesely ..................... 361/679.01 |
| 8,385,063 | B2 * | 2/2013 | Zhu et al. .................. 361/679.58 |
| 8,467,178 | B2 * | 6/2013 | Probst et al. ............. 361/679.27 |
| 8,467,179 | B2 * | 6/2013 | Probst et al. ............. 361/679.27 |
| 8,467,183 | B2 * | 6/2013 | Probst et al. ............. 361/679.55 |
| 8,472,177 | B2 * | 6/2013 | Probst et al. ............. 361/679.27 |
| 8,749,963 | B2 * | 6/2014 | Staats et al. .............. 361/679.26 |
| 8,792,231 | B2 * | 7/2014 | Derryberry .............. 361/679.26 |
| 2003/0030971 | A1 * | 2/2003 | Duarte ......................... 361/680 |
| 2003/0103324 | A1 * | 6/2003 | Gallivan ...................... 361/681 |
| 2005/0105264 | A1 * | 5/2005 | Chen ............................ 361/683 |
| 2006/0205447 | A1 * | 9/2006 | Park et al. ................... 455/575.1 |
| 2006/0209218 | A1 * | 9/2006 | Lee et al. ......................... 349/1 |
| 2007/0236872 | A1 * | 10/2007 | Kuo ............................. 361/681 |
| 2009/0231795 | A1 * | 9/2009 | Green ...................... 361/679.27 |
| 2011/0141679 | A1 * | 6/2011 | Dai et al. ................. 361/679.27 |
| 2011/0199727 | A1 * | 8/2011 | Probst ...................... 361/679.09 |
| 2012/0154999 | A1 * | 6/2012 | Park ......................... 361/679.01 |

* cited by examiner

*Primary Examiner* — Lisa Lea Edmonds
(74) *Attorney, Agent, or Firm* — Staas & Halsey LLP (57) ABSTRACT

An electronic apparatus includes a body and a display panel installed at a front side of the body to display an image. The body includes a first member to form a portion of the body and allowing the display panel to be installed thereon, and a second member to form a remaining portion of the body and rotatably installed at the first member. As the second member serves as a support, the electronic apparatus may be disposed in a second mode for a user to conveniently use the electronic apparatus.

23 Claims, 8 Drawing Sheets

ELECTRONIC APPARATUS HAVING A DISPLAY PANEL

CROSS-REFERENCE TO RELATED APPLICATIONS

This application claims priority under 35 U.S.C. §119 from Korean Patent Application No. 2012-0011833, filed on Feb. 6, 2012 in the Korean Intellectual Property Office, the disclosure of which is incorporated herein by reference in its entirety.

BACKGROUND OF THE INVENTION

1. Field of the Invention

Embodiments of the present disclosure relate to an electronic apparatus having a body and a display panel disposed on the body to display an image.

2. Description of the Related Art

Among recent electronic devices, there is an electronic apparatus having a display panel provided at a front of a body of the electronic apparatus to display an image thereon.

Electronic apparatuses having a display panel at the front thereof, including a portable multimedia player (PMP) and a tablet personal computer, are formed in a shape of a thin rectangular plate, such that the display panel is provided with a wide display area and is convenient to carry.

However, when such an electronic apparatus is placed on a shelf or the like and used, a user may need to hold the apparatus at an angle or set the apparatus on a separate support to have a front of the display panel disposed upward to see an image displayed on a screen of the display panel.

SUMMARY OF THE INVENTION

The present general inventive concept provides an electronic apparatus which may be placed on a reference surface to be conveniently usable in a mode thereof.

Additional features and utilities of the present general inventive concept will be set forth in part in the description which follows and, in part, will be obvious from the description, or may be learned by practice of the general inventive concept The foregoing and/or other features and utilities of the present general inventive concept may be achieved by providing an electronic apparatus including a body and a display panel installed at a front of the body to display an image, and the body may include a first member to form a portion of the body to allow the display panel to be installed thereon, and a second member to form a remaining portion of the body to be rotatably installed at the first member.

The second member may rotate to move between a first position at which the second member is parallel with the first member and a second position at which the second member forms an angle of less than 180° with the first member.

The first member may be provided with a keyboard at an upper surface thereof, and the display panel may be movably installed at the first member to move to cover or expose the keyboard.

The electronic apparatus may further include a sliding unit to allow the display panel to be movably installed at the body.

The sliding unit may include a first slider installed at a front of the first member, and a second slider installed at a rear of the display panel and movably installed at the first slider.

The first slider may include a pair of first rail portions provided at both lateral ends thereof to allow the second slider to be movably installed at the first rail portions, and the second slider may include a pair of second rail portions provided at both lateral ends thereof to be movably installed at the first rail portions.

The electronic apparatus may further include a hinge unit allowing the second member to be rotatably installed at the first member.

The hinge unit may include a first hinge member installed at the first member, a second hinge member installed at the second member and rotatably coupled to the first hinge member, and a hinge axle allowing the first hinge member and second hinge member to be rotatably coupled to each other.

The hinge unit may be movably installed at the first member to be spaced apart from the first member as it moves.

The first hinge member may be movably installed at the first member.

The hinge unit may include a cam portion integrally formed at the first hinge member, a cam member installed at the hinge axle to be axially movable, and an elastic member to elastically support the cam member toward the cam portion.

The cam portion may include a first cam surface having crests and troughs alternately formed in a circumferential direction thereof, and the cam member may include a second cam surface provided with crests and troughs alternately formed in a circumferential direction thereof and facing the first cam surface.

The electronic apparatus may further include a sliding unit to allow the display panel to be movably installed at the body, and a hinge unit to allow the second member to be rotatably installed at the first member. The sliding unit may include a first slider installed at a front of the first member, and a second slider installed at a rear of the display panel and movably installed at the first slider. The hinge unit may include a first hinge member movably installed at the first slider, a second hinge member installed at the second member and rotatably coupled to the first hinge member, and a hinge axle to which the first hinge member and second hinge member are rotatably coupled.

The hinge unit may further include a third slider movably installed at the first slider, and a connection member provided with one end fixed to the first hinge member and the other end fixed to the third slider to connect the first hinge member and the third slider to each other.

The first slider may include a pair of first rail portions provided at both lateral ends of the first slider and a pair of third rail portions provided at a lower surface of the first slider to be spaced apart from each other to allow the third slider to be movably installed at the third rail portions, the second slider may include a pair of second rail portions provided at both lateral ends of the second slider to be movably installed at the first rail portions, and the third slider may include a pair of fourth rail portions provided at both lateral ends of the third slider to be movably installed at the third rail portions.

The second hinge member may include a pressing portion to apply force to the first member according to rotation of the second member.

The body may include the first member and the second member rotatably installed at a rear end of the first member. The second member may serve as a support when the second member rotates and the rear end thereof moves such that the electronic apparatus may be conveniently used with the body and the front of the display panel installed at the body disposed slanted.

The foregoing and/or other features and utilities of the present general inventive concept may be achieved by providing an electronic apparatus including a display panel, and a body having a first member to support the display panel to slidably move with respect to a front side of the first member and a second member rotatably coupled to the first member to move with respect to the first member between a first position to form a first angle and a second position to form a second angle with respect to the front side of the first member.

The first member may include a key board; the display panel moves with respect to the first member; and the key board of the first member may be usable or unusable according to a movement of the display panel.

The electronic apparatus may be in a first mode of a tablet computer apparatus when the second member is in the first portion and in a second mode of a laptop computer apparatus when the second member is in the second position.

The first angle may be smaller than the second angle.

The electronic apparatus may further include a first slider disposed on the first member, a second slider disposed on the display panel to slide along a first portion of the first slider such that the display panel moves with respect to the first member, and a third slider disposed to slide along a second portion of the first slider such that the second member moves with respect to the first member.

The electronic apparatus may further include a hinge unit having a first hinge member coupled to the third slider and a second hinge member coupled to the second member such that the second member slides and rotates with respect to the first member.

The foregoing and/or other features and utilities of the present general inventive concept may be achieved by providing an electronic apparatus including a display panel and a body having a first member to support the display panel disposed on a front side of the first member, a second member rotatably coupled to the first member to move with respect to the first member between a first position to form a first angle and a second position to form a second angle with respect to the front side of the first member, and a key board disposed between the display panel and the front side of the first member and covered or exposed according to a movement of the display panel with respect to the first member.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Figure 1:
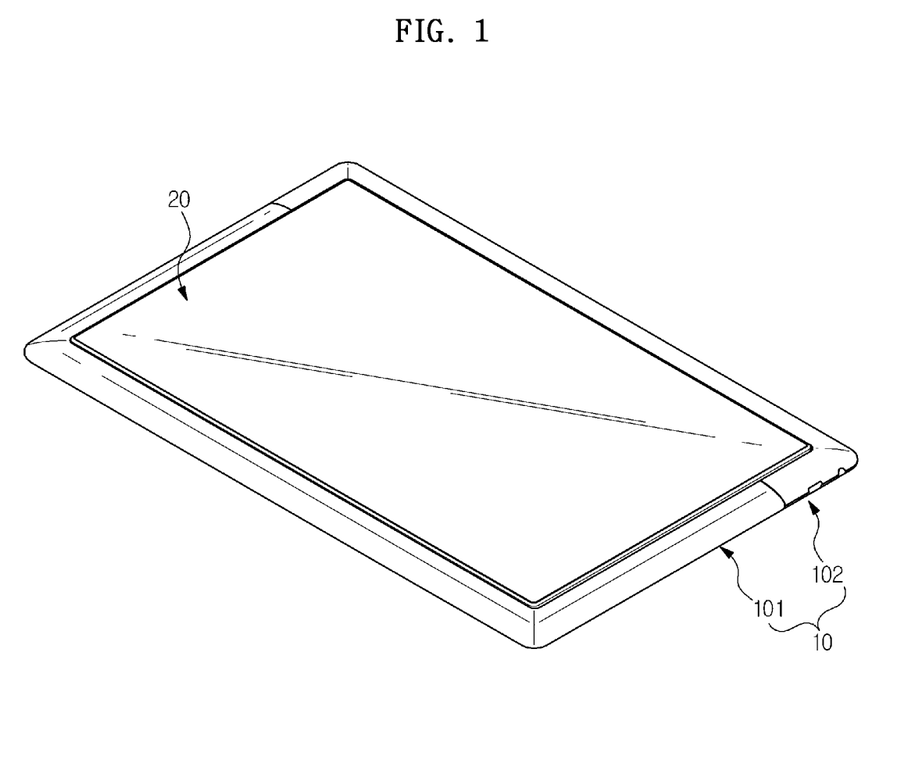
FIG. 1 is a perspective view illustrating an electronic apparatus according to an exemplary embodiment of the present general inventive concept.

As illustrated in FIG. 1, an electronic apparatus according to an exemplary embodiment of the present general inventive concept includes a body 10 and a display panel 20 installed at a front side of the body 10 to display an image on a screen thereof.

Figure 2:
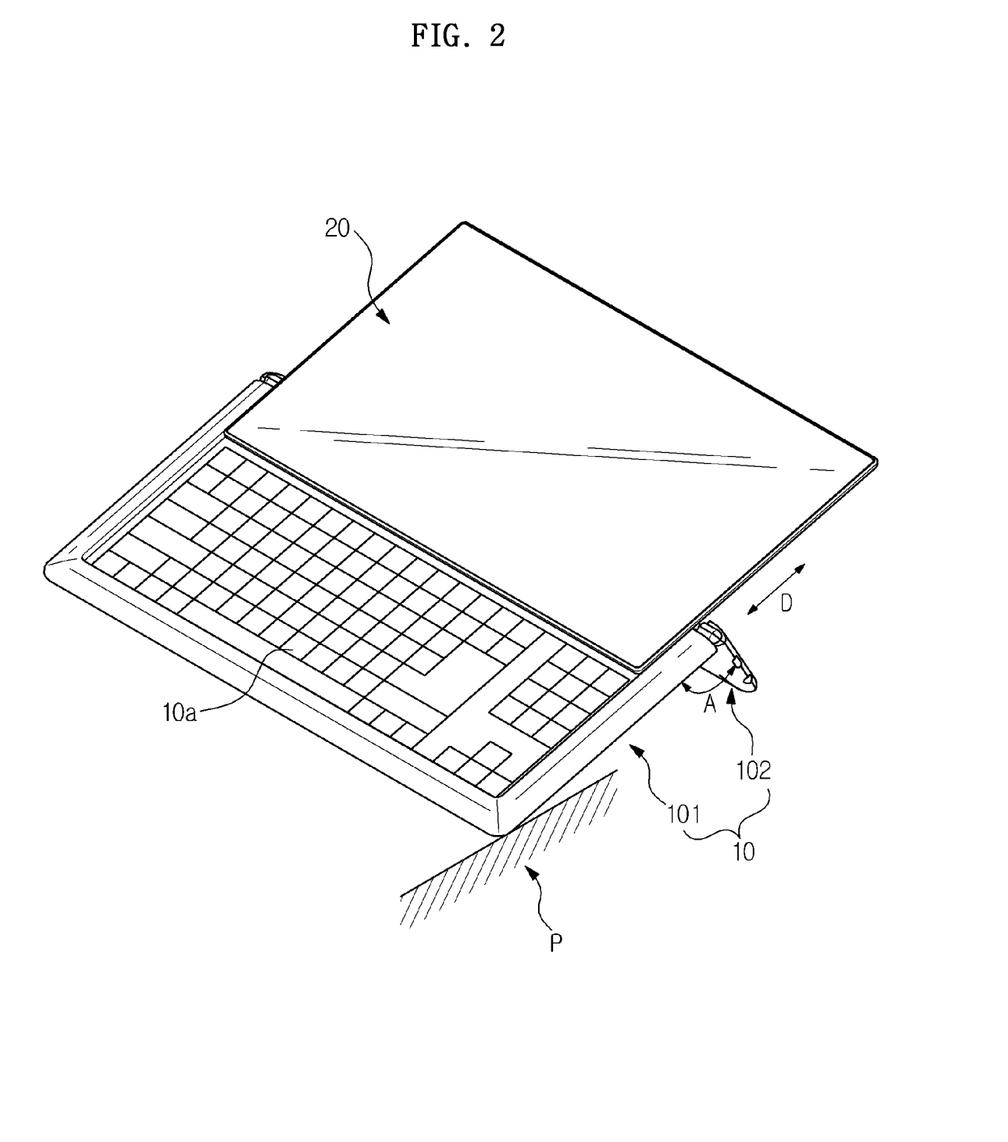
FIG. 2 is a perspective view illustrating rotation of a second member of the electronic apparatus of FIG. 1 according to an exemplary embodiment of the present general inventive concept.
Figure 3:
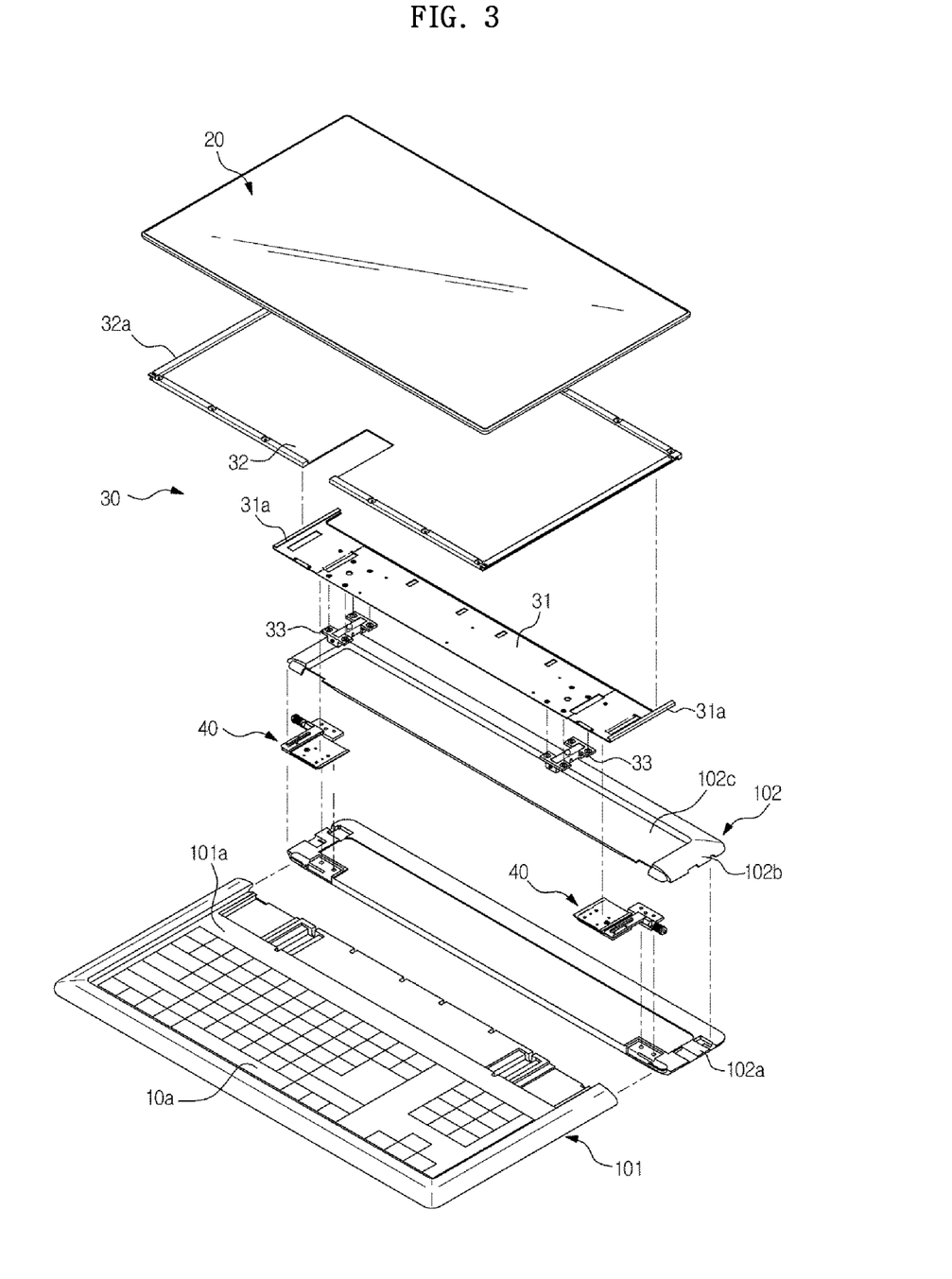
FIG. 3 is an exploded perspective view illustrating the electronic apparatus of FIG. 1 according to an exemplary embodiment of the present general inventive concept.

As illustrated in FIGS. 2 and 3, the body 10 includes a first member 101 to form a portion of the body 10 and a second member 102 connected to an end of the first member 101 to form a remaining portion of the body 10. The first member 101 forms a front end of the body 10, and the second member 102 forms a rear end of the body 10 to be connected to a rear end of the first member 101. The second member 102 may be is provided with a same as or a shorter length than the first member 101 in a front-to-rear direction D. However, the present general inventive concept is not limited thereto. The first member 101 and the second member 102 may have different lengths according to a design or user preference.

The first member 101 includes a first accommodation portion 101a provided at a front side (or upper side) thereof to accommodate at least a portion of the display panel 20, and an input unit, such as a keyboard 10a, is arranged in the first accommodation portion 101a to allow a user to input a command or data therethrough. The first member 101 may have a first portion formed with the first accommodation portion 101a to provide the key board 10a and a second portion to support the display panel 20. The first member 101 may have one or more circuit units disposed therein to receive a command and data from the keyboard 10a or an input/output unit of the display panel 20 and to control and process data to perform a function of the electronic apparatus.

The display panel 20 is movably installed at the front side of the first member 101 such that the display panel 20 may cover or expose the keyboard 10a by moving with respect to the first member 101. It is possible that the display panel 20 may be disposed to slidably move with respect to the first member 101 in the front-rear direction D.

The second member 102 includes a second accommodation portion 102c provided at the front side of the second member 102 to accommodate a remaining portion of the display panel 20 and is rotatably installed at the rear end of the first member 101 such that the second member 102 rotates to move between a first position at which the second member 102 is parallel with the first member 101 and a second position at which the second member 102 forms an angle A with the first member 101. The angle A may be less than 180° between major surfaces or front sides of the first member 101 and the second member 102.

The second member 102 is allowed to remain at the first position at which it is parallel with the first member 101 so that the electronic apparatus can be easily carried in a first mode, and is also allowed to rotate to be positioned at the second position so that the electronic apparatus can be placed on a reference plane P, for example, a shelf or table in a second mode A rear end of the second member 102 protrudes downward with respect the display panel 20 or the first member 101 such that the second member 102 serves as a support for the electronic apparatus, and thereby the first member 101 and the display panel 20 are arranged slanted upward with respect to the reference plane P when the second member 102 moves backward. Accordingly, a user may have a viewing angle to easily see the display panel 20 of the electronic apparatus placed on the reference plane, for example, the shelf.

The electronic apparatus includes a sliding unit 30 to allow the display panel 20 to be movably installed at the first member 101, and a hinge unit 40 to allow the second member 102 to be rotatably installed at the rear end of the first member 101. The second member 102 includes a lower housing 102a and an upper housing 102b coupled to each other for installation of the hinge unit 40 such that at least a portion of the hinge unit 40 is arranged between the lower housing 102a and upper housing 102b.

The sliding unit 30 includes a first slider 31 installed at the second portion of the first member 101, and a second slider 32 installed at a rear side (or bottom side) of the display panel 20 and movably installed at the first slider 31. The first slider 31 is provided with a pair of first rail portions 31a at both lateral ends thereof and may have a bracket shape. The second slider 32 is provided with a pair of second rail portions 32a at both lateral ends thereof to be movably installed in the first rail portions 31a. In the embodiment, the first slider 31 may be fixedly coupled to the first member 101 through a fixing member 33 having a lower end fixed to the first member 101 and an upper end fixed to the first slider 31 and may be spaced apart from the first member 101 to provide a space to accommodate or install a third slider 48 therein, which will be described later with reference to FIG. 5.

Figure 4:
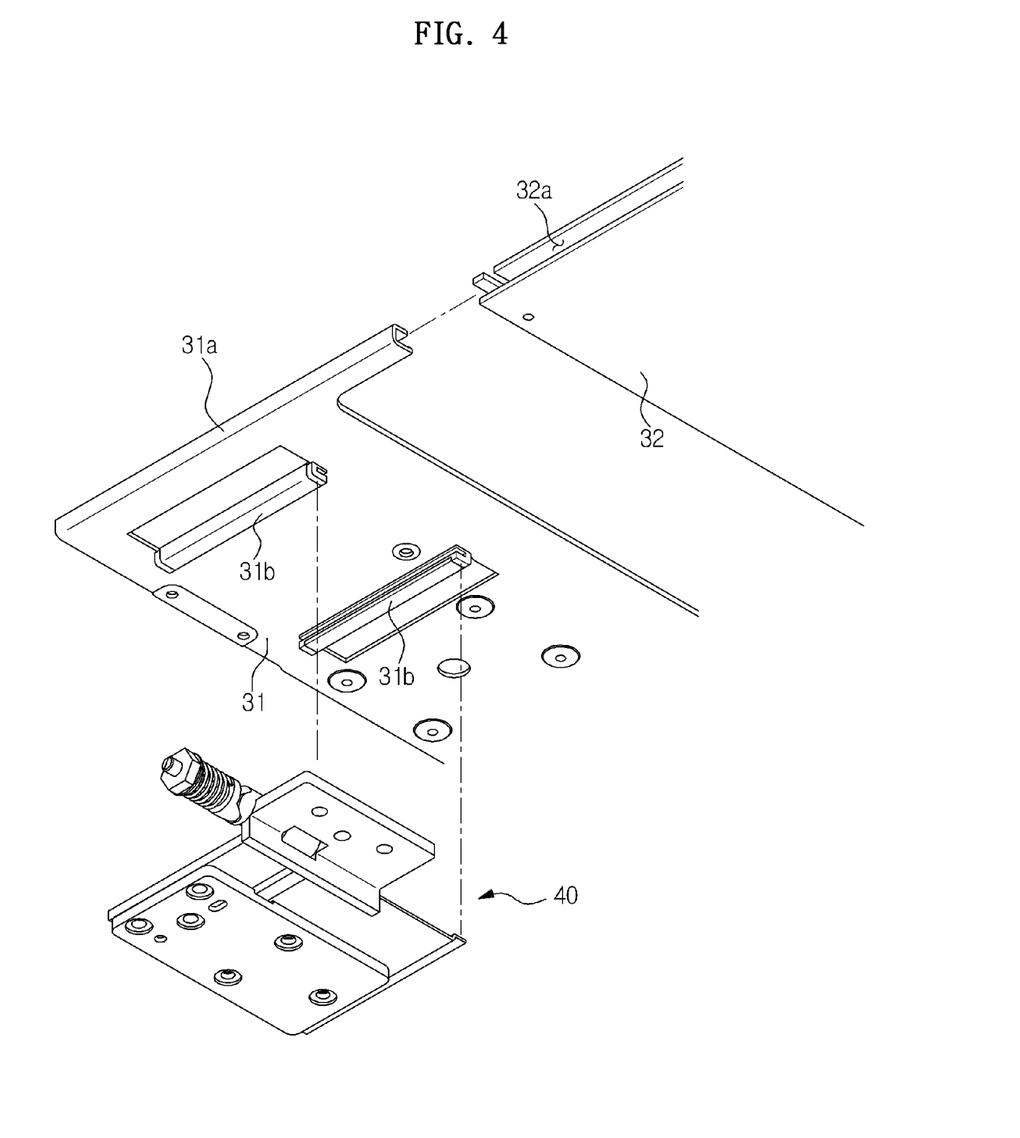
FIG. 4 is a perspective view illustrating a hinge unit usable with the electronic apparatus of FIG. 1 according to an exemplary embodiment of the present general inventive concept.
Figure 5:
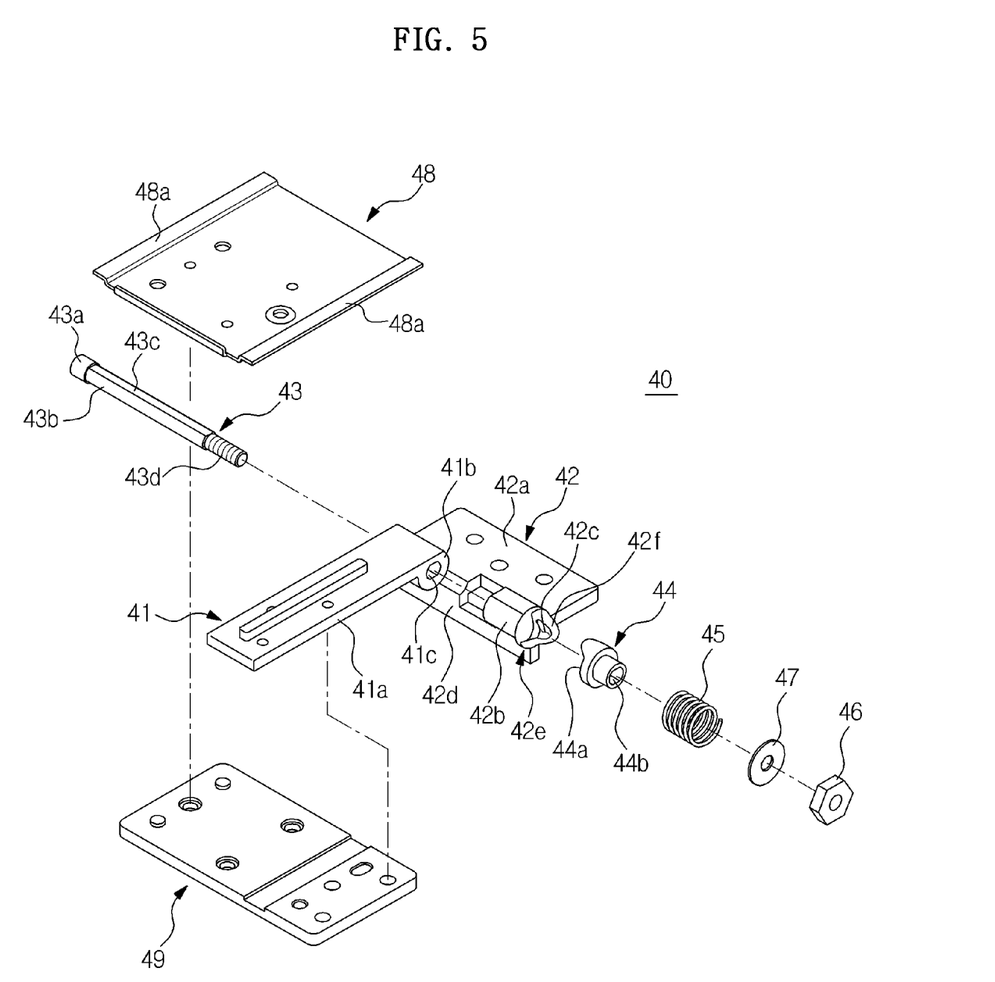
FIG. 5 is an exploded perspective view illustrating the hinge unit of FIG. 4 according to an exemplary embodiment of the present general inventive concept.

As illustrated in FIGS. 4 and 5, the hinge unit 40 includes a first hinge member 41 installed at the first member 101, a second hinge member 42 installed at the second member 102, and a hinge axle 43 to allow the first hinge member 41 and second hinge member 42 to be rotatably coupled to each other.

The first hinge member 41 includes a first installation portion 41a installed at the first member 101, and a first hinge portion 41b provided with a first hinge hole 41c through which the hinge axle 43 is installed. The second hinge member 42 includes a second installation portion 42a installed at the second member 102, and a second hinge portion 42b provided with a second hinge hole 42c through which the hinge axle 43 is installed. The second hinge member 103 may have a pressing portion 42d to be useable to move the second member 102 with respect to the first member 101.

The hinge axle 43 includes a head portion 43a supported by a portion adjacent to the first hinge hole 41c, and an axle portion 43b installed through the first hinge hole 41c and second hinge hole 42c. The axle portion 43b is provided with a flat portion 43c to limit a rotation of a cam member 44, and a fastening portion 43d formed at the leading end of the axle portion 43b to be coupled with a coupling element, for example, a nut 46, which will be described later.

As the axle portion 43b of the hinge axle 43 is arranged through the first hinge hole 41c and subsequently through the second hinge hole 42c, and the nut 46 is fixed to the leading end of the axle portion 43b with a washer 47 interposed between the nut 46 and the leading end of the axle portion 43b, the first hinge member 41 and second hinge member 42 are rotatably connected to each other.

Also, the hinge unit 40 allows the second member 102 to rotate in a semi-automatic manner and at the same time maintains the second member 102 at the first position or second position until force exceeding a certain level of force is applied thereto. To this end, the hinge unit 40 includes a cam portion 42e integrally provided at a portion adjacent to the second hinge hole 42c of the second hinge member 42, a cam member 44 installed at the hinge axle 43 to be axially movable, and an elastic member 45 to elastically support the cam member 44 toward the cam portion 42e.

The cam portion 42e is provided with a first cam surface 42f having a concave and convex shape, for example, crests and troughs alternately formed in a circumferential direction of the first hinge hole 42c. The cam member 44 includes an installation hole 40b formed in a shape corresponding to that of the axle portion 43b of the hinge axle 43 to allow the cam member 44 to be installed at the axle portion 43b and axially movable, and a second cam surface 44a provided with crests and troughs alternately formed in the circumferential direction of the installation hole 40b and disposed to face the first cam surface 42f.

Also, in the electronic apparatus according to the embodiment of the present general inventive concept, the hinge unit 40 is movably installed at the first member 101 to allow the second member 102 to be spaced apart from and rotate around the first member 101 such that a smooth rotation of the second member 102 can be provided within a minimized gap between the first member 101 and the second member 102.

The hinge unit 40 includes a third slider 48 movably installed at the first slider 31 fixedly coupled to the first member 101, and a connection member 49 having one end 49a fixed to the first installation portion 41a of the first hinge member 41 and the other end 49b fixed to the third slider 48 and thereby connecting the first hinge member 41 with the third slider 48.

The first slider 31 includes a pair of third rail portions 31b spaced apart from each other and installed at the lower surface of the first slider 31 to allow the third slider 48 to be movably installed at the pair, and the third slider 48 includes fourth rail portions 48a provided at both ends of the third slider 48 to be movably installed at the corresponding third rail portions 31b.

In the illustrated embodiment, rotation and movement of the second member 102 may occur at the same time. To this end, the second hinge member 42 is provided with the pressing portion 42d to apply force to the rear end of the first member 101 according to rotation of the second member 102.

Hereinafter, an operation of the electronic apparatus as illustrated in FIGS. 1-5 according to the embodiment of the present general inventive concept will be described with reference to the drawings.

Figure 6:
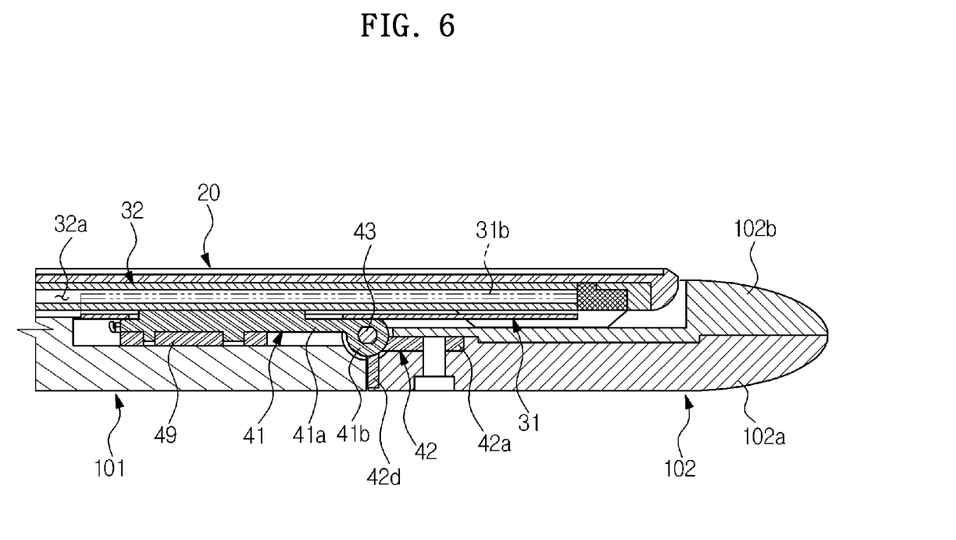
FIGS. 6 and 8 are cross-sectional views illustrating an operation of the electronic apparatus of FIG. 1 according to an exemplary embodiment of the present general inventive concept.

As illustrated in FIG. 6, when the electronic apparatus is in a first mode, for example, to be carried or stored, the first member 101 and second member 102 are arranged in the same plane such that the electronic apparatus has a shape, for example, a rectangular plate shape.

When the second member 102 is rotated beyond a certain angle of rotation to set and use the electronic apparatus on a reference plane or surface, for example, a shelf, the second member 102 further rotates by a predetermined angle according to interaction between the first cam surface 42f and the second cam surface 44a such that a predetermined angle is formed between the first member 101 and the second member 102 in a second mode. The first mode be referred to a mode usable as an electronic apparatus (or a tablet apparatus) without function of the keyboard 10a or a mode usable as an electronic apparatus to be carried or held by a user. However, it is possible that the electronic apparatus can be usable on a reference plane in the first mode. The second mode may be referred to a mode useable as an electronic apparatus or a laptop computer apparatus) with function of the key board 10a or a mode useable as an electronic apparatus to provide a better viewing angle to a user when the electronic apparatus is placed on the reference plane or surface.

Figure 7:
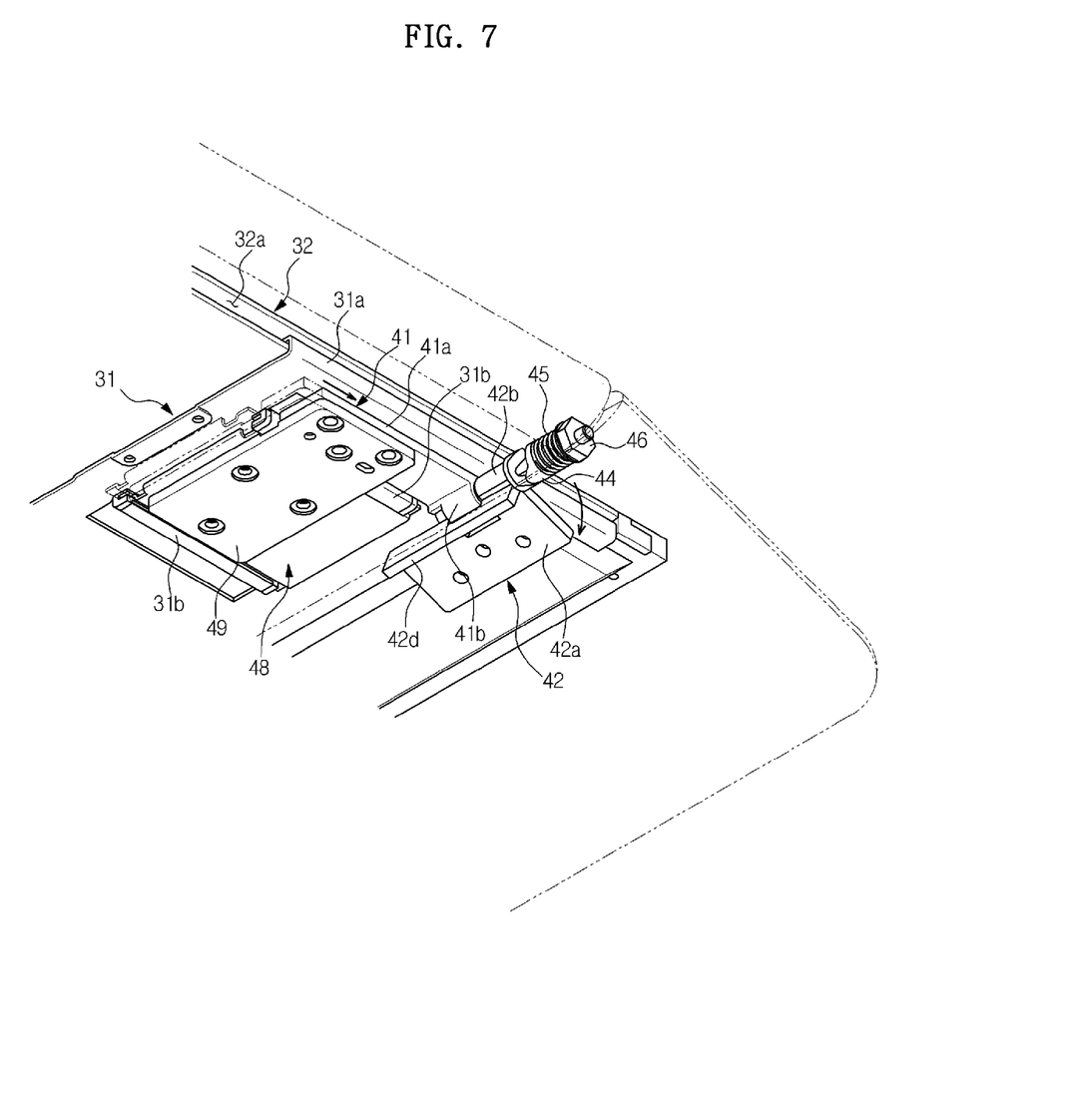
FIG. 7 is a perspective view illustrating an operation of the hinge unit usable with the electronic apparatus of FIG. 1 according to an exemplary embodiment of the present general inventive concept.
Figure 8:
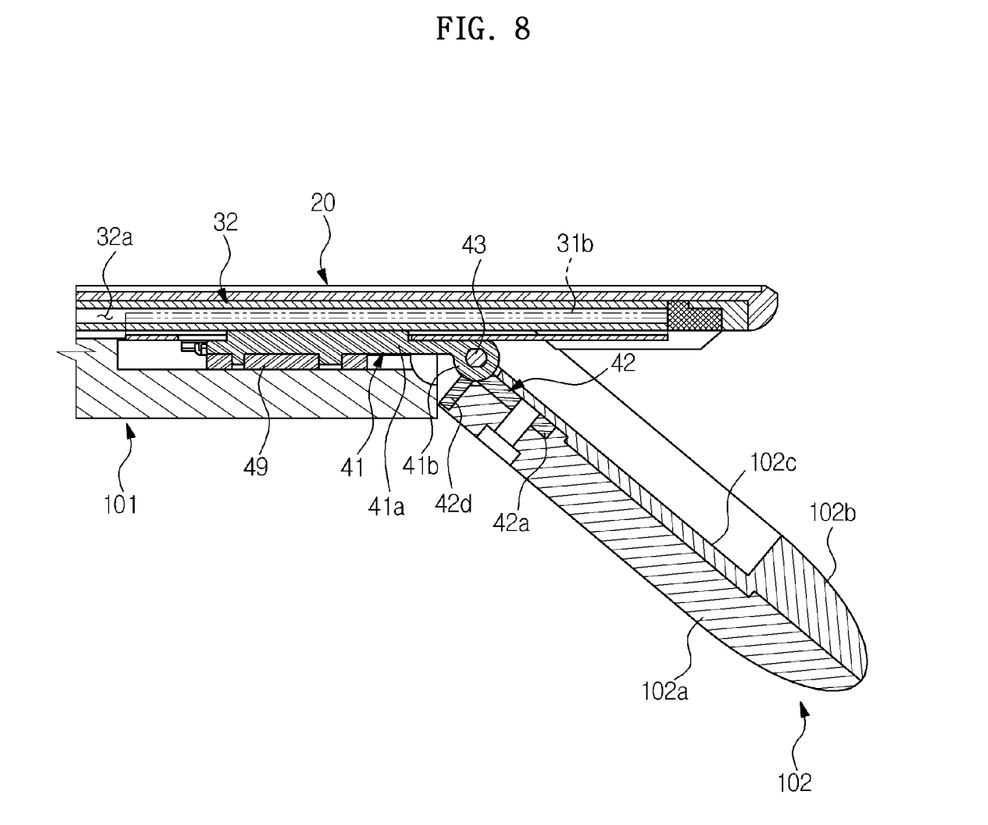

When the second member 102 is rotated, a lower end of the pressing portion 42d of the second hinge member 42 protrudes toward the rear end of the first member 101 to apply force to the rear end of the first member 101, as illustrated in FIG. 7. Since the second member 102 is movably installed at the first member 101 through the first slider 31 installed at the third slider 48 of the hinge unit 40 and the body 10 as described above, the second member 102 is moved away from the first member 101 by the repulsive force corresponding to the force applied by the pressing portion 42d and spaced from the first member 101. That is, when the second member 102 rotates, it also moves to be spaced from the first member 101 by a distance, as illustrated in FIG. 8.

As such, the second member 102 is rotated such that the rear end of the second member 102 protrudes downward when the electronic apparatus is put on a reference plane, such as a shelf, thereby serving as a support. Therefore, the first member 101 and the display panel 20 installed at the first member 101 may be disposed such that the rear end of the display panel 20 is slanted upward and the rear end of the first member 101 and the front end of the second member 102 are also slanted upward when the electronic apparatus having the first member 101 and the second member 102 are disposed on the reference plane, for example, the shelf Accordingly, the electronic apparatus in the second mode may allow the user to conveniently use the display panel 20 and the keyboard 10a of the electronic apparatus.

In the embodiment, the first hinge member 41 is movably installed at the first member 101 to minimize a gap formed between the first member 101 and second member 102. However, the present general inventive concept is not limited thereto. It is possible that the electronic apparatus may be provided with an adequate gap between the first member 101 and second member 102, and the first hinge member 41 may be fixed to the first member 101.

In the embodiment, the first hinge member 41 is movably installed at the body 10 through the first slider 31. However, the present general inventive concept is not limited thereto. The first hinge member 41 may be movably installed directly at the body 10.

In the embodiment, the display panel 20 is movably installed at the first member 101. However, the present general inventive concept is not limited thereto. The display panel 20 may be fixed to the first member 101.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. An electronic apparatus, comprising:
a body; and
a display panel installed at a front side of the body to display an image,
wherein the body includes a first member to form a portion of the body and to allow the display panel to be installed thereon, and a second member to form a remaining portion of the body and rotatably installed at the first member to serve as a support,
wherein when the second member rotates, the electronic apparatus is supported on a plane by the second member.

2. The electronic apparatus according to claim 1, wherein the second member rotates to move between a first position at which the second member is parallel with the first member and a second position at which the second member forms an angle of less than 180° with the first member.

3. The electronic apparatus according to claim 2, further comprising:
a sliding unit to allow the display panel to be movably installed at the body.

4. The electronic apparatus according to claim 3, wherein the sliding unit includes a first slider installed at a front side of the first member, and a second slider installed at a rear side of the display panel and movably installed at the first slider.

5. The electronic apparatus according to claim 4, wherein:
the first slider includes a pair of first rail portions provided at both lateral ends thereof to allow the second slider to be movably installed at the first rail portions; and
the second slider includes a pair of second rail portions provided at both lateral ends thereof to be movably installed at the first rail portions.

6. The electronic apparatus according to claim 2, further comprising:
a sliding unit to allow the display panel to be movably installed at the body; and
a hinge unit to allow the second member to be rotatably installed at the first member, wherein:
the sliding unit includes a first slider installed at a front side of the first member, and a second slider installed at a rear side of the display panel and movably installed at the first slider; and
the hinge unit includes a first hinge member movably installed at the first slider, a second hinge member installed at the second member and rotatably coupled to the first hinge member, and a hinge axle to which the first hinge member and second hinge member are rotatably coupled.

7. The electronic apparatus according to claim 6, wherein the hinge unit further includes a third slider movably installed at the first slider, and a connection member provided with one end fixed to the first hinge member and the other end fixed to the third slider to connect the first hinge member and the third slider to each other.

8. The electronic apparatus according to claim 7, wherein:
the first slider includes a pair of first rail portions provided at both lateral ends of the first slider and a pair of third rail portions provided at a lower surface of the first slider to be spaced apart from each other to allow the third slider to be movably installed at the third rail portions;
the second slider includes a pair of second rail portions provided at both lateral ends of the second slider to be movably installed at the first rail portions; and
the third slider includes a pair of fourth rail portions provided at both lateral ends of the third slider to be movably installed at the third rail portions.

9. The electronic apparatus according to claim 6, wherein the second hinge member includes a pressing portion to apply a force to the first member according to a rotation of the second member.

10. The electronic apparatus according to claim 1, wherein:
the first member is provided with a keyboard at an upper surface thereof; and
the display panel is movably installed at the first member to cover or expose the keyboard.

11. The electronic apparatus according to claim 1, further comprising:
a hinge unit to allow the second member to be rotatably installed at the first member.

12. The electronic apparatus according to claim 11, wherein the hinge unit includes a first hinge member installed at the first member, a second hinge member installed at the second member and rotatably coupled to the first hinge member, and a hinge axle to allow the first hinge member and second hinge member to be rotatably coupled to each other.

13. The electronic apparatus according to claim 12, wherein the hinge unit is movably installed at the first member such that the second member is spaced apart from the first member according to a movement of the hinge unit with respect to the first member.

14. The electronic apparatus according to claim 13, wherein the first hinge member is movably installed at the first member.

15. The electronic apparatus according to claim 12, wherein the hinge unit includes a cam portion integrally formed at the first hinge member, a cam member installed at the hinge axle to be axially movable, and an elastic member to elastically support the cam member toward the cam portion.

16. The electronic apparatus according to claim 15, wherein:
the cam portion includes a first cam surface having crests and troughs alternately formed in a circumferential direction thereof; and
the cam member includes a second cam surface provided with crests and troughs alternately formed in a circumferential direction thereof to face the first cam surface.

17. An electronic apparatus comprising:
a display panel; and
a body having a first member to support the display panel to slidably move with respect to a front side of the first member and a second member rotatably coupled to the first member to move with respect to the first member between a first position to form a first angle and a second position to form a second angle with respect to the front side of the first member.

18. The electronic apparatus of claim 17, wherein:
the first member includes a key board;
the display panel moves with respect to the first member; and
the key board of the first member is usable or unusable according to a movement of the display panel.

19. The electronic apparatus of claim 17, wherein the electronic apparatus is in a first mode of a tablet computer apparatus when the second member is in the first portion and in a second mode of a laptop computer apparatus when the second member is in the second position.

20. The electronic apparatus of claim 17, wherein the first angle is smaller than the second angle.

21. The electronic apparatus of claim 17, further comprising:
a first slider disposed on the first member;
a second slider disposed on the display panel to slide along a first portion of the first slider such that the display panel moves with respect to the first member; and
a third slider disposed to slide along a second portion of the first slider such that the second member moves with respect to the first member.

22. The electronic apparatus of claim 20, further comprising:
a hinge unit having a first hinge member coupled to the third slider and a second hinge member coupled to the second member such that the second member slides and rotates with respect to the first member.

23. An electronic apparatus comprising:
a display panel; and
a body having a first member to support the display panel disposed on a front side of the first member, a second member rotatably coupled to the first member to move with respect to the first member between a first position to form a first angle and a second position to form a second angle with respect to the front side of the first member, and a key board disposed between the display panel and the front side of the first member and covered or exposed according to a movement of the display panel with respect to the first member.

* * * * *